(12) United States Patent
Qin et al.

(10) Patent No.: US 9,647,704 B2
(45) Date of Patent: May 9, 2017

(54) DIGITAL PREDISTORTION SYSTEM AND METHOD BASED ON ENVELOPE TRACKING AND RADIO FREQUENCY SYSTEM

(71) Applicant: Huawei Technologies Co., Ltd., Shenzhen (CN)

(72) Inventors: Jianhua Qin, Beijing (CN); Ya Lin, Beijing (CN); Huabin Liu, Beijing (CN); Zhiwei Zhang, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/981,592

(22) Filed: Dec. 28, 2015

(65) Prior Publication Data

US 2016/0197627 A1    Jul. 7, 2016

(30) Foreign Application Priority Data

Jan. 4, 2015  (CN) .......................... 2015 1 0003881

(51) Int. Cl.
*H04B 1/04*     (2006.01)
*H03F 1/02*     (2006.01)
(Continued)

(52) U.S. Cl.
CPC ......... *H04B 1/0475* (2013.01); *H03F 1/0227* (2013.01); *H03F 1/3258* (2013.01);
(Continued)

(58) Field of Classification Search
CPC ................ H04B 1/0475; H04B 1/0003; H04B 2001/0416; H04B 2001/0425
See application file for complete search history.

(56) References Cited

U.S. PATENT DOCUMENTS 6,642,786 B1   11/2003  Jin et al.
7,706,467 B2    4/2010  Kenington
(Continued)

FOREIGN PATENT DOCUMENTS

CN    103916093 A    7/2014
CN    104113285 A    10/2014

OTHER PUBLICATIONS

Ding, "Digital Predistortion of Power Amplifiers for Wireless Applications," School of Electrical and Computer Engineering, Georgia Institute of Technology, Atlanta, Georgia (Mar. 2004).
(Continued)

*Primary Examiner* — Freshteh N Aghdam
(74) *Attorney, Agent, or Firm* — Leydig, Voit & Mayer, Ltd.

(57) ABSTRACT

Embodiments of the present disclosure a digital predistortion system and method based on envelope tracking, and a radio frequency system, so as to reduce complexity of the digital predistortion system based on envelope tracking. The system includes: a digital predistorter, a digital-to-analog converter, a frequency mixer, a power amplifier, and a power supply apparatus; where a value range of a predistortion signal that is obtained when the digital predistorter uses a first processing manner is within a first interval, and in this case, a value of a supply voltage generated by the power supply apparatus is a constant; a value range of the predistortion signal that is obtained when the digital predistorter uses a second processing manner is within a second interval, and in this case, a change of the supply voltage generated by the power supply apparatus tracks a change of an envelope signal of the predistortion signal.

20 Claims, 11 Drawing Sheets

(51) Int. Cl.
*H03F 1/32* (2006.01)
*H03F 3/195* (2006.01)
*H03F 3/24* (2006.01)
*H04B 1/00* (2006.01)

(52) U.S. Cl.
CPC .............. *H03F 3/195* (2013.01); *H03F 3/245* (2013.01); *H04B 1/0003* (2013.01); *H03F 2200/102* (2013.01); *H04B 2001/0416* (2013.01); *H04B 2001/0425* (2013.01)

(56) References Cited

U.S. PATENT DOCUMENTS

| | | | | |
|---|---|---|---|---|
| 8,380,143 | B2* | 2/2013 | Yang | H03F 1/3247 375/296 |
| 2003/0107434 | A1* | 6/2003 | Mitzlaff | H03F 1/0222 330/149 |
| 2006/0229036 | A1* | 10/2006 | Muller | H03F 1/3282 455/114.3 |
| 2007/0063772 | A1* | 3/2007 | Carichner | H03F 1/3241 330/149 |
| 2009/0004981 | A1* | 1/2009 | Eliezer | H03F 1/0211 455/127.1 |
| 2012/0105150 | A1 | 5/2012 | Wimpenny | |
| 2012/0194271 | A1 | 8/2012 | Yamamoto et al. | |
| 2014/0105327 | A1 | 4/2014 | Geng et al. | |
| 2014/0199949 | A1 | 7/2014 | Nagode et al. | |
| 2015/0023445 | A1* | 1/2015 | Camuffo | H03F 1/02 375/268 |
| 2015/0372646 | A1* | 12/2015 | Briffa | H03F 1/025 330/297 |
| 2016/0072530 | A1* | 3/2016 | El-Hassan | H03F 1/0227 455/114.2 |

OTHER PUBLICATIONS

Kim et al., "Optimization for Envelope Shaped Operation of Envelope Tracking Power Amplifier," IEEE Transaction on Microwave Theory and Techniques, vol. 59, Issue 7, pp. 1781-1795, Institute of Electrical and Electronics Engineers, New York, New York (Jul. 2011).

* cited by examiner

| Envelope signal | Vcc (V) |
|---|---|
| 0 | 0.95609 |
| 1 | 0.958866 |
| 2 | 0.961642 |
| 3 | 0.964418 |
| 4 | 0.967194 |
| 5 | 0.96997 |
| ... | ... |
| ... | ... |
| ... | ... |

DIGITAL PREDISTORTION SYSTEM AND METHOD BASED ON ENVELOPE TRACKING AND RADIO FREQUENCY SYSTEM

CROSS-REFERENCE TO RELATED APPLICATIONS

This application claims priority to Chinese Patent Application No. 201510003881.7, filed on Jan. 4, 2015, which is hereby incorporated by reference in its entirety.

TECHNICAL FIELD

The present disclosure relates to the field of communications technologies, and in particular, to a digital predistortion system and method based on envelope tracking, and a radio frequency system.

BACKGROUND

As smart wireless terminals develop, standby time of a wireless terminal receives growing concern. A manner of increasing the standby time is using a battery of a large capacity in the wireless terminal. Another manner is maximizing work efficiency of a power-consuming device in the wireless terminal, for example, a power amplifier (PA). To ensure performance such as an adjacent channel leakage ratio (ACLR), the PA may work in a linear region. FIG. 1 is a schematic diagram of a work area of a PA, where a horizontal axis Vin represents an input signal of the PA, and a vertical axis Vout represents an output signal of the PA. It can be seen that the work area of the PA includes a linear region and a non-linear region. In the linear region, a gain (an amplification multiple) of the PA is a constant. However, in the non-linear region, that is, in a compression region shown in FIG. 1, the gain of the PA is no longer a constant, which means that a change of the input signal of the PA is no longer constant, and generally, the gain decreases compared with that in the linear region. It can be seen from FIG. 1 that when an input of the PA is greater than a specific extent, an output of the PA basically remains unchanged, that is, an output voltage is equal to or approximately equal to a supply voltage. The supply voltage in this case is a limit of the output voltage.

Generally, an output-signal voltage of the PA fluctuates greatly. Therefore, the supply voltage of the PA has to be high enough to cover all output signals within a dynamic voltage range. However, when an input-signal voltage and the output-signal voltage of the PA are relatively low, a very high supply voltage is also used, which causes a great waste of PA energy and very low power supply efficiency. A PA linearization technology enables the PA to work in the compression region, and to acquire ACLR performance similar to ACLR performance that is acquired when the PA works in the linear region. A typical technology thereof is ET (Envelope tracking). Using the technology, fine management is performed on the supply voltage of the PA, and the supply voltage is adjusted in real time as the input-signal voltage of the PA fluctuates, so that the power supply efficiency of the PA is greatly improved. Specifically, referring to FIG. 2, Vcc represents a supply voltage when a PA does not use the ET technology, and Vcc (ET) represents a supply voltage when the PA uses the ET technology. It can be seen that, when the PA uses the ET technology, the supply voltage of the PA fluctuates with an input-signal voltage, and does not need to remain as a constant voltage all the time, so that the supply voltage Vcc (ET) is equal to or approximately equal to an output voltage of the PA, that is, the supply voltage Vcc (ET) tracks a change of an input voltage of the PA, thereby effectively improving the power supply efficiency.

The ET technology enables, by dynamically adjusting the supply voltage of the PA, the PA to have a consistent signal gain at each output-signal power point, that is, a linear gain is achieved. FIG. 3 is a schematic diagram showing a relationship between a supply voltage and a gain of a PA in an ideal state. A horizontal axis represents an input of the PA, and a vertical axis represents an output of the PA. Multiple solid curves corresponding to Vcc1 to Vcc5 reflect a process in which an output signal of the PA changes with an input signal when a corresponding constant supply voltage is used. For example, a solid curve corresponding to Vcc1 shows an input/output signal relationship of the PA at the constant supply voltage Vcc1. There is a non-linear region in the solid curve. A thick dashed line shows an input signal/output signal relationship of the PA in ET, that is, the gain of the PA. For an input signal Vin of a different amplitude, a corresponding Vcc is used as the supply voltage. There are multiple choices for the supply voltage, for example, a successive increase from Vcc1 to Vcc5. When the PA works in the ET mode, because the supply voltage is no longer constant, the input signal and the output signal that are of the PA may maintain a linear relationship indicated by the thick dashed line. For example, when the input signal is Vin1, a value of a corresponding output-signal voltage at a corresponding gain is Vcc2, and in this case, Vcc2 may be used as the supply voltage; when the input signal is Vin2, a value of a corresponding output-signal voltage at a corresponding gain is Vcc3, and in this case, Vcc3 may be used as the supply voltage. The ET mode is used, and the supply voltage of the PA is adjusted, so that the supply voltage of the PA is approximately equal to the output-signal voltage of the PA, ensuring that an unnecessary electricity waste is reduced when the PA works.

In practical application, the input signal of the PA may be very weak. However, Vcc cannot be infinitely small, and there is only one minimum voltage shown by Vcc1 in FIG. 3. Therefore, a constant gain of the PA may not be achieved, and FIG. 3 is only an ideal case in the ET mode. As shown in FIG. 4, FIG. 4 is a schematic diagram showing another relationship between a supply voltage and a gain of a PA in the ET mode. The gain of the PA, that is, an input signal/output signal relationship may be divided into three parts. For details, refer to a thick dashed line in FIG. 4. Gains in a first segment, a second segment, and a third segment that are of the thick dashed line are different. The first segment indicates that the gain of the PA is constant, that is, a constant gain, and a minimum supply voltage Vcc1 may be used for power supply. The second segment is a transitional region in which an internal gain changes, and the Vcc1 may also be used for power supply. In the third segment, the gain is constant, and a changing Vcc may be used for power supply, that is, another voltage greater than Vcc1 is used for power supply. Therefore, in the ET mode, a system may obtain an output-signal voltage according to an input signal and the constant gain that are of the PA, so that the supply voltage Vcc of the PA is adjusted based on the output-signal voltage, it is implemented that a change of the Vcc tracks a change of the input signal of the PA, and the Vcc is approximately equal to the output-signal voltage.

Although gains in all the segments of the dashed line in FIG. 4 are the same, gains of the PA corresponding to output signals in different parts of an entire work area are inconsistent. Therefore, a digital baseband needs to be used for compensation processing. A typical compensation method is to use a DPD (Digital Predistortion, digital predistortion) technology. In a digital domain, a deviation between an expected gain that is set and an actual gain of the PA is corrected. That is, the input signal is processed before the input signal is amplified by the PA, so that the input signal changes to compensate non-linearity of the gain of the PA. FIG. 5 is a schematic diagram showing a structure of a radio frequency system based on digital predistortion in the ET mode. The radio frequency system includes a digital predistorter 51, configured to: receive a digital signal, where the digital signal is a baseband signal, that is, a digital domain signal before a radio frequency is sent. The digital predistorter 51 processes the digital signal to obtain a predistortion signal. The predistortion signal is sent to an ET system 52. The ET system 52 includes two paths. One is a signal path, including a DAC (digital-to-analog converter) 521, a high-pass filter 522, a frequency mixer 523, and a PA 524. A structure of the path is the same as that of a conventional transmitter. The other path of the ET system 52 is an envelope path, including an envelope signal calculator 525, a voltage converter 526, and a voltage generator 527. The digital-to-analog converter 521 is configured to perform digital-to-analog conversion on the predistortion signal to generate an analog signal. The high-pass filter 522 is configured to filter out noise in the analog signal. The frequency mixer 523 is configured to modulate the analog signal to a radio-frequency carrier fc to obtain a radio frequency signal input Vin. The PA 524 is configured to perform power amplification on the radio frequency signal input Vin to generate a radio frequency signal output Vout. The envelope signal calculator 525 is configured to calculate an envelope signal of the predistortion signal. The voltage converter 526 implements Env-Vcc conversion, that is, converts the envelope signal obtained by the envelope signal calculator 525 into a digital voltage, where the digital voltage is a representation of a real supply voltage of an actual PA in the digital domain. The voltage generator 527 is a digital-to-analog conversion apparatus, configured to convert the digital voltage into the real supply voltage of the PA, that is, an analog supply voltage Vcc. The supply voltage Vcc that is generated in the ET system 52 and that is of the PA may change with a signal envelope. In addition, the radio frequency signal output Vout generated by the PA 524 passes through a front-end module, for example, a duplexer 53, and is transmitted to an antenna 54. The antenna 54 transmits a radio frequency signal Vout. Because the voltage converter 526 converts the envelope signal into a corresponding digital voltage and the voltage generator 527 eventually generates the Vcc, a one-to-one correspondence between the Vcc and the envelope signal is implemented. The one-to-one correspondence may be stored in a form of a table. For details, refer to FIG. 6. FIG. 6 shows a lookup table (Lookup table, LUT) for Env-Vcc conversion, and reflects how the voltage converter 526 converts, based on the lookup table, an envelope signal into a corresponding supply voltage value.

FIG. 7 is a schematic diagram showing relationships between respective input/output signal amplitudes of a digital predistorter 51, an ET system 52, and an entire radio frequency system. The ET system 52 introduces predistortion of a signal gain of a PA, so that an input and an output of the PA are not completely linear, which means that the digital predistorter 51 performs inverse transformation on signal distortion of the ET system in advance, so that a predistortion gain between a DPD input and a DPD output, and a gain of the PA complement each other, and a system eventually implements a linear gain from a digital signal input into the digital predistorter 51 to an output Vout of the PA. Specifically, if a predistortion gain introduced by the digital predistorter 51 is A1 and an amplification gain of the PA is A2, for any one input/output of the radio frequency system, a gain is $A0=A1 \times A2$, where A0 is a constant value, indicating that the gain of the entire radio frequency system relative to a change of an input signal is constant.

A typical digital predistorter 51 is a table searcher, and the table searcher performs digital predistortion processing by using a lookup table algorithm. That is, signals of the DPD input and the DPD output are divided into a plurality of intervals (for example, 256 intervals), and a lookup table is formed based on these intervals, to implement a function for searching for the DPD output based on the DPD input. The lookup table is similar to the lookup table shown in FIG. 6 in form, and is different only in specific content of an entry. However, an implementation manner of the lookup table algorithm consumes an area of a chip and increases costs, and a real-time update of the lookup table is inconvenient. Another typical DPD implementation solution is to use a fitting polynomial manner for processing. That is, one polynomial is used for fitting an entire curve of the gain of the PA, and a gain of the PA corresponding to a specific input of the PA is obtained by using the curve, so that a DPD gain complementary to the gain of the PA is obtained, and eventually, it is implemented that a fitting is performed on a digital predistortion processing algorithm by using one polynomial. However, in the ET mode, the digital predistorter 51 needs to use one polynomial to fit an entire digital predistortion process, resulting in a complicated structure of the polynomial and excessive coefficients used in the polynomial. Therefore, a structure of the digital predistorter 51 is relatively complicated, and a fitting effect may not be ideally consistent with an actual gain curve.

SUMMARY

Embodiments of the present disclosure provide a digital predistortion system and method based on envelope tracking, and a radio frequency system, so as to reduce complexity of the digital predistortion system based on envelope tracking.

According to a first aspect, an embodiment of the present disclosure provides a digital predistortion system based on envelope tracking, including: a digital predistorter, configured to receive a digital signal, and perform predistortion processing on the digital signal to obtain a predistortion signal; a digital-to-analog converter, configured to receive the predistortion signal, and convert the predistortion signal into an analog signal; a frequency mixer, configured to receive the analog signal from the digital-to-analog converter, and modulate the analog signal to obtain a radio frequency input signal; a power amplifier, configured to receive a supply voltage, and amplify the radio frequency input signal under function of the supply voltage to obtain a radio frequency output signal; and a power supply apparatus, configured to receive the predistortion signal, and generate the supply voltage based on the predistortion signal; where: the digital predistorter can work in any one of multiple processing manners, where the multiple processing manners include a first processing manner and a second processing manner; a value range of the predistortion signal that is obtained when the digital predistorter works in the first processing manner is within a first interval, and a value range of the predistortion signal that is obtained when the digital predistorter works in the second processing manner is within a second interval; the first interval corresponds to a first amplitude range of the radio frequency output signal, the second interval corresponds to a second amplitude range of the radio frequency output signal, the first amplitude range is from M1 to M2, and the second amplitude range is from M2 to M3; and M3 is greater than M2 and M3 is less than or equal to a maximum value of the supply voltage, M2 is greater than M1 and M2 is greater than or equal to a minimum value of the supply voltage, the minimum value of the supply voltage is greater than 0, and M1 is greater than or equal to 0 and is less than the minimum value of the supply voltage; when the digital predistorter obtains the predistortion signal whose value range is within the first interval, a value of the supply voltage generated by the power supply apparatus is M2; when the digital predistorter obtains the predistortion signal whose value range is within the second interval, a change of the supply voltage generated by the power supply apparatus tracks a change of an envelope signal of the predistortion signal, and the power amplifier works in a non-linear region; and under function of a predistortion gain of the digital predistorter and an amplification gain of the power amplifier, a system gain of the radio frequency output signal relative to the digital signal is a constant, where the predistortion gain reflects a change of the predistortion signal relative to the digital signal, and the amplification gain reflects a change of the radio frequency output signal relative to the radio frequency input signal.

According to the first aspect, in a first possible implementation manner of the first aspect, M1 is 0; in the first processing manner, the predistortion gain is a first constant predistortion gain, the power amplifier works in a linear region, the amplification gain is a first constant amplification gain, and the system gain is produced under function of the first constant predistortion gain and the first constant amplification gain; and in the second processing manner, the predistortion gain is a second constant predistortion gain, the amplification gain is a second constant amplification gain, and the system gain is produced under function of the second constant predistortion gain and the second constant amplification gain. Optionally, the first interval and the second interval may not be adjacent. Optionally, the first interval and the second interval may not be adjacent. The first constant predistortion gain is greater than the second constant predistortion gain.

According to the first aspect, in a second possible implementation manner of the first aspect, M1 is 0; in the first processing manner, the digital predistorter uses a first fitting polynomial manner to perform predistortion processing on the digital signal to obtain the predistortion signal, the predistortion gain is a first variable predistortion gain, the power amplifier works in a linear region or in the non-linear region, the amplification gain is a first variable amplification gain, and the system gain is produced under function of the first variable predistortion gain and the first variable amplification gain; and in the second processing manner, the predistortion gain is a second constant predistortion gain, the amplification gain is a second constant amplification gain, and the system gain is produced under function of the second constant predistortion gain and the second constant amplification gain. Optionally, the first interval and the second interval may be adjacent.

According to the first aspect, in a third possible implementation manner of the first aspect, M1 is 0; in the first processing manner, the digital predistorter uses a first fitting polynomial manner to perform predistortion processing on the digital signal to obtain the predistortion signal, the predistortion gain is a first variable predistortion gain, the power amplifier works in a linear region or in the non-linear region, the amplification gain is a first variable amplification gain, and the system gain is produced under function of the first variable predistortion gain and the first variable amplification gain; and in the second processing manner, the digital predistorter uses a second fitting polynomial manner to perform predistortion processing on the digital signal to obtain the predistortion signal, the predistortion gain is a second variable predistortion gain, the amplification gain is a second variable amplification gain, and the system gain is produced under function of the second variable predistortion gain and the second variable amplification gain. Optionally, the first interval and the second interval may be adjacent.

According to the first aspect, in a fourth possible implementation manner of the first aspect, M1 is greater than 0; the multiple processing manners include a third processing manner; a value range of the predistortion signal that is obtained when the digital predistorter works in the third processing manner is within a third interval; the third interval corresponds to a third amplitude range of the radio frequency output signal, and the third amplitude range is from 0 to M1; and when the digital predistorter obtains the predistortion signal whose value range is within the third interval, the value of the supply voltage generated by the power supply apparatus is M2; in the first processing manner, the digital predistorter uses a first fitting polynomial manner to perform predistortion processing on the digital signal to obtain the predistortion signal, the predistortion gain is a first variable predistortion gain, the power amplifier works in the non-linear region, the amplification gain is a first variable amplification gain, and the system gain is produced under function of the first variable predistortion gain and the first variable amplification gain; in the second processing manner, the predistortion gain is a second constant predistortion gain, the amplification gain is a second constant amplification gain, and the system gain is produced under function of the second constant predistortion gain and the second constant amplification gain; and in the third processing manner, the predistortion gain is a first constant predistortion gain, the power amplifier works in a linear region, the amplification gain is a first constant amplification gain, and the system gain is produced under function of the first constant predistortion gain and the first constant amplification gain. Optionally, the first interval and the second interval may be adjacent, and the first interval and the third interval may be adjacent.

According to the first aspect, in a fifth possible implementation manner of the first aspect, M1 is greater than 0; the multiple processing manners include a third processing manner; a value range of the predistortion signal that is obtained when the digital predistorter works in the third processing manner is within a third interval; the third interval corresponds to a third amplitude range of the radio frequency output signal, and the third amplitude range is from 0 to M1; and when the digital predistorter obtains the predistortion signal whose value range is within the third interval, the value of the supply voltage generated by the power supply apparatus is M2; in the first processing manner, the digital predistorter uses a first fitting polynomial manner to perform predistortion processing on the digital signal to obtain the predistortion signal, the predistortion gain is a first variable predistortion gain, the power amplifier works in the non-linear region, the amplification gain is a first variable amplification gain, and the system gain is produced under function of the first variable predistortion gain and the first variable amplification gain; in the second processing manner, the digital predistorter uses a second fitting polynomial manner to perform predistortion processing on the digital signal to obtain the predistortion signal, the predistortion gain is a second variable predistortion gain, the amplification gain is a second variable amplification gain, and the system gain is produced under function of the second variable predistortion gain and the second variable amplification gain; and in the third processing manner, the predistortion gain is a first constant predistortion gain, the power amplifier works in a linear region, the amplification gain is a first constant amplification gain, and the system gain is produced under function of the first constant predistortion gain and the first constant amplification gain. Optionally, the first interval and the second interval may be adjacent, and the first interval and the third interval may be adjacent.

According to any one of the second to the fifth possible implementation manners of the first aspect, in a sixth possible implementation manner of the first aspect, the digital predistortion system based on envelope tracking further includes: a memory, configured to store a polynomial coefficient, where the digital predistorter is configured to read the polynomial coefficient from the memory, and apply the polynomial coefficient to the first fitting polynomial.

According to the third possible implementation manner or the fifth possible implementation manner of the first aspect, in a seventh possible implementation manner of the first aspect, the digital predistortion system based on envelope tracking further includes: a memory, configured to store a polynomial coefficient, where the digital predistorter is configured to read the polynomial coefficient from the memory, and apply the polynomial coefficient to the first fitting polynomial and the second fitting polynomial.

According to the first aspect or any one of the first to the seventh possible implementation manners of the first aspect, in an eighth possible implementation manner of the first aspect, the power supply apparatus includes: an envelope calculator, configured to receive the predistortion signal, and extract the envelope signal of the predistortion signal; a voltage converter, configured to receive the envelope signal from the envelope calculator, and convert the envelope signal into a digital voltage; and a voltage generator, configured to receive the digital voltage from the voltage converter, and convert the digital voltage into the supply voltage.

According to the eighth possible implementation manner of the first aspect, in a ninth possible implementation manner of the first aspect, the voltage converter is specifically configured to convert the envelope signal into the digital voltage based on a lookup table algorithm.

According to the first aspect or any one of the first to the ninth possible implementation manners of the first aspect, in a tenth possible implementation manner of the first aspect, the digital predistortion system based on envelope tracking further includes: a high-pass filter, coupled between the digital-to-analog converter and the frequency mixer, and configured to filter out noise in the analog signal before the frequency mixer receives the analog signal.

According to the first aspect or any one of the first to the tenth possible implementation manners of the first aspect, in an eleventh possible implementation manner of the first aspect, the digital predistorter is a digital logic circuit.

According to a second aspect, an embodiment of the present disclosure further provides a radio frequency system, where the radio frequency system includes the digital predistortion system disclosed in the first aspect or in any one of the first to the eleventh possible implementation manners of the first aspect, and further includes: a duplexer, configured to receive the radio frequency output signal from the power amplifier, and couple the radio frequency output signal to an antenna; and the antenna, configured to transmit the radio frequency output signal.

According to a third aspect, an embodiment of the present disclosure further provides a digital predistortion method based on envelope tracking, including: receiving a digital signal, and performing predistortion processing on the digital signal to obtain a predistortion signal; converting the predistortion signal into an analog signal; modulating the analog signal to obtain a radio frequency input signal; generating a supply voltage based on the predistortion signal; and amplifying the radio frequency input signal under function of the supply voltage to obtain a radio frequency output signal; where: the performing predistortion processing on the digital signal to obtain a predistortion signal includes: using any one of multiple processing manners to perform predistortion processing on the digital signal to obtain the predistortion signal, where the multiple processing manners include a first processing manner and a second processing manner; a value range of the predistortion signal that is obtained when the first processing manner is used is within a first interval, and a value range of the predistortion signal that is obtained when a digital predistorter uses the second processing manner is within a second interval; the first interval corresponds to a first amplitude range of the radio frequency output signal, the second interval corresponds to a second amplitude range of the radio frequency output signal, the first amplitude range is from M1 to M2, and the second amplitude range is from M2 to M3; and M3 is greater than M2 and M3 is less than or equal to a maximum value of the supply voltage, M2 is greater than M1 and M2 is greater than or equal to a minimum value of the supply voltage, the minimum value of the supply voltage is greater than 0, and M1 is greater than or equal to 0 and is less than the minimum value of the supply voltage; when the predistortion signal whose value range is within the first interval is obtained, a value of the supply voltage is M2; when the predistortion signal whose value range is within the second interval is obtained, a change of the supply voltage tracks a change of an envelope signal of the predistortion signal; and under function of a predistortion gain and an amplification gain, a system gain of the radio frequency output signal relative to the digital signal is a constant, where the predistortion gain reflects a change of the predistortion signal relative to the digital signal, and the amplification gain reflects a change of the radio frequency output signal relative to the radio frequency input signal.

According to the third aspect, in a first possible implementation manner of the third aspect, the generating a supply voltage based on the predistortion signal includes: extracting the envelope signal of the predistortion signal; converting the envelope signal into a digital voltage; and converting the digital voltage into the supply voltage.

According to the first possible implementation manner of the third aspect, in a second possible implementation manner of the third aspect, the converting the envelope signal into a digital voltage includes: converting the envelope signal into the digital voltage based on a lookup table algorithm.

The embodiments of the present disclosure provide the digital predistortion system and method based on envelope tracking, and the radio frequency system, where a digital predistorter thereof uses different processing manners to obtain predistortion signals each of which is within a range of a different interval. No table searcher is required to implement the entire digital predistorter, and no complex fitting polynomial is required to implement a logical algorithm of the digital predistorter either. Therefore, an implementation manner is simpler, which helps reduce an implementation cost of the digital predistorter in addition to better implementing digital predistortion.

BRIEF DESCRIPTION OF DRAWINGS

To describe the technical solutions in the embodiments of the present disclosure or in the prior art more clearly, the following briefly introduces the accompanying drawings required for describing the embodiments or the prior art. Apparently, the accompanying drawings in the following description are merely simplified schematic diagrams of some embodiments of the present disclosure or the prior art, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 8:
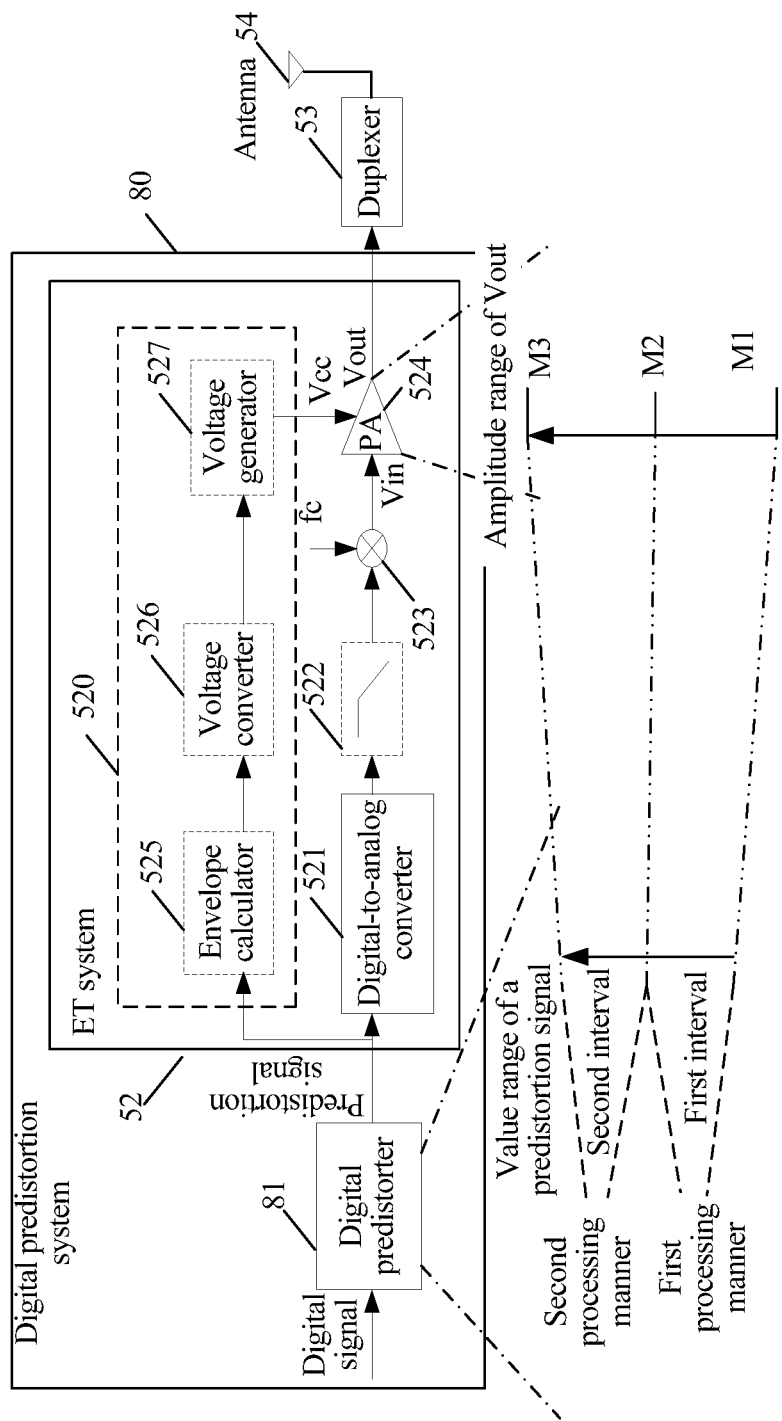
FIG. 8 is a schematic diagram of a working principle of a radio frequency system according to an embodiment of the present disclosure.

FIG. 8 is a schematic diagram of a working principle of a radio frequency system according to an embodiment of the present disclosure, where the radio frequency system includes a digital predistortion system 80, a duplexer 53, and an antenna 54. For example, the digital predistortion system 80 may be implemented by using an integrated circuit manufacturing technique, so as to form one or more chips. The duplexer 53 and the antenna 54 may be implemented by using an off-chip technology, and work together with the one or more chips. The digital predistortion system 80 may include a digital predistorter 81 and an ET system 52. The digital predistorter 81 may be a digital logic circuit, that is, work in a digital domain. The ET system 52 may be a digital-analog hybrid circuit, a part of which may work in the digital domain and another part of which may work in an analog domain or in a digital-analog hybrid domain. Specifically, the ET system 52 includes two paths, where one path includes a digital-to-analog converter 521, a frequency mixer 523, and a PA 524, and the other path of the ET system 52 includes a power supply apparatus 520.

Figure 9:
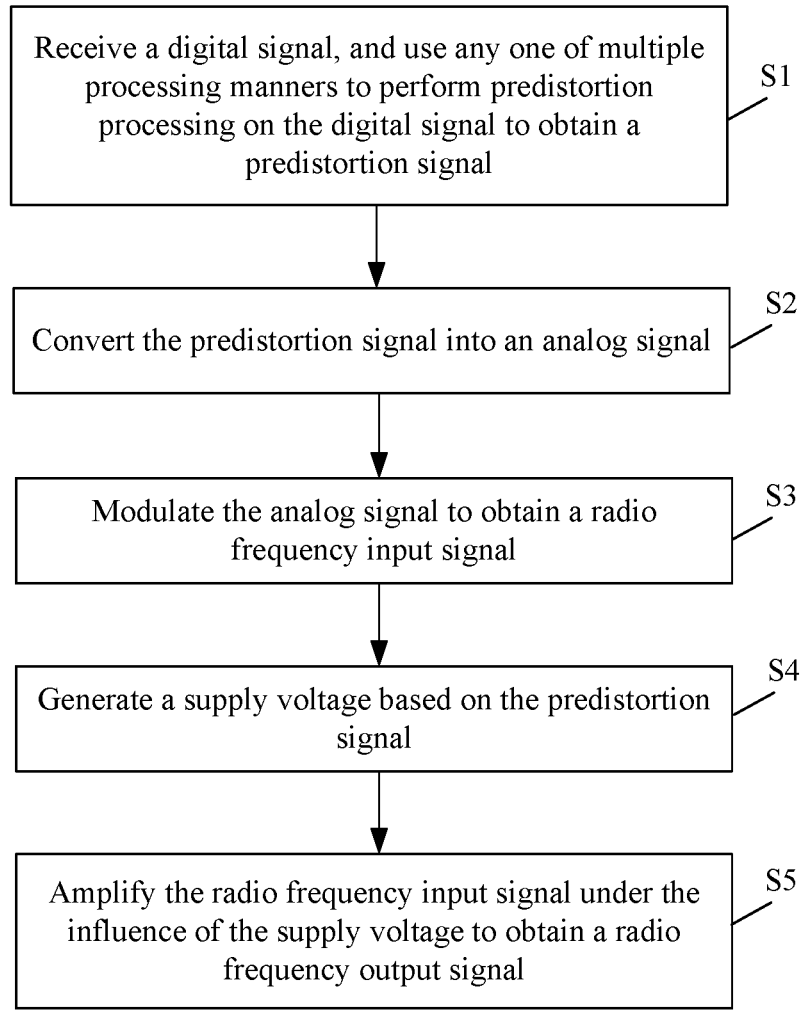
FIG. 9 is a brief schematic diagram of a work process of a digital predistortion system according to an embodiment of the present disclosure.

A work process of the digital predistortion system 80 is shown in FIG. 9, including: S1. The digital predistorter 81 receives a digital signal, and uses any one of multiple processing manners to perform predistortion processing on the digital signal to obtain a predistortion signal, where the multiple processing manners may include a first processing manner and a second processing manner. S2. The digital-to-analog converter 521 receives the predistortion signal, and converts the predistortion signal in the digital domain into an analog signal. S3. The frequency mixer 523 receives the analog signal from the digital-to-analog converter 521, and modulates the analog signal to obtain a radio frequency input signal Vin. A modulated signal used by the frequency mixer 523 may be fc. That is, the analog signal of a low frequency is modulated to a high frequency signal whose frequency is fc, that is, modulated to the radio frequency input signal Vin. S4. The power supply apparatus 520 receives the predistortion signal, and generates a supply voltage Vcc based on the predistortion signal. S5. The PA 524 receives the supply voltage Vcc from the power supply apparatus 520, and amplifies the radio frequency input signal Vin under function of the supply voltage to obtain a radio frequency output signal Vout. Optionally, a high-pass filter 522 may further be coupled between the digital-to-analog converter 521 and the frequency mixer 523, and is configured to filter out noise in the analog signal before the frequency mixer receives the analog signal. The digital-to-analog converter 521, the high-pass filter 522, the frequency mixer 523, and the PA 524 are configured to process the predistortion signal, and the generated radio frequency output signal Vout may be transmitted by using the antenna 54. The duplexer 53 receives the radio frequency output signal Vout from the power amplifier 524, and couples the radio frequency output signal Vout to the antenna 54. The power supply apparatus 520 may adjust the supply voltage Vcc of the PA 524 based on the predistortion signal, so as to minimize power consumption of the digital predistortion system 80 as the ET technology does, which is mentioned in the background.

In the digital predistortion system 80, the digital predistorter 81 is specifically configured to: use the first processing manner to obtain the predistortion signal whose value range is within a first interval, and use the second processing manner to obtain the predistortion signal whose value range is within a second interval. The first interval corresponds to a first amplitude range of the radio frequency output signal, the second interval corresponds to a second amplitude range of the radio frequency output signal, the first amplitude range is from M1 to M2, and the second amplitude range is from M2 to M3. The first amplitude range and the second amplitude range are both voltage ranges. M3 is greater than M2 and M3 is less than or equal to a maximum value of the supply voltage, M2 is greater than M1 and M2 is greater than or equal to a minimum value of the supply voltage, the minimum value of the supply voltage is greater than 0, and M1 is greater than or equal to 0 and is less than the minimum value of the supply voltage. When the value range of the predistortion signal that is obtained by the digital predistorter 81 is within the first interval, a value of the supply voltage generated by the power supply apparatus 520 is a constant M2, and the ET system 52 in this case does not implement an ET function. When the value range of the predistortion signal that is obtained by the digital predistorter 81 is within the second interval, a change of the supply voltage generated by the power supply apparatus 520 tracks a change of an envelope signal of the predistortion signal. In this case, the power amplifier 524 works in a non-linear region, that is, the ET system 52 in this case is implementing the ET function.

Figure 1:
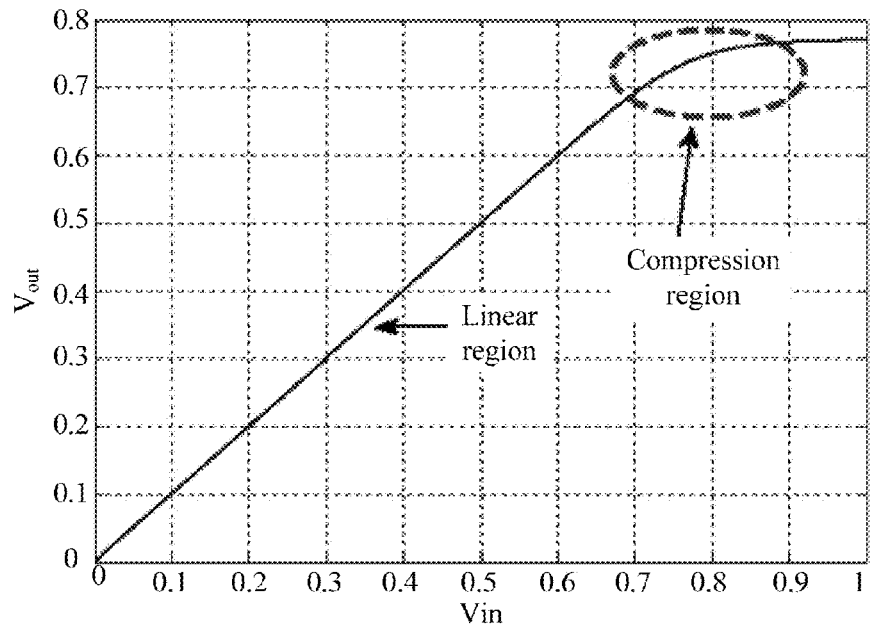
FIG. 1 is a schematic diagram of a work area of a PA according to the prior art.
Figure 2:
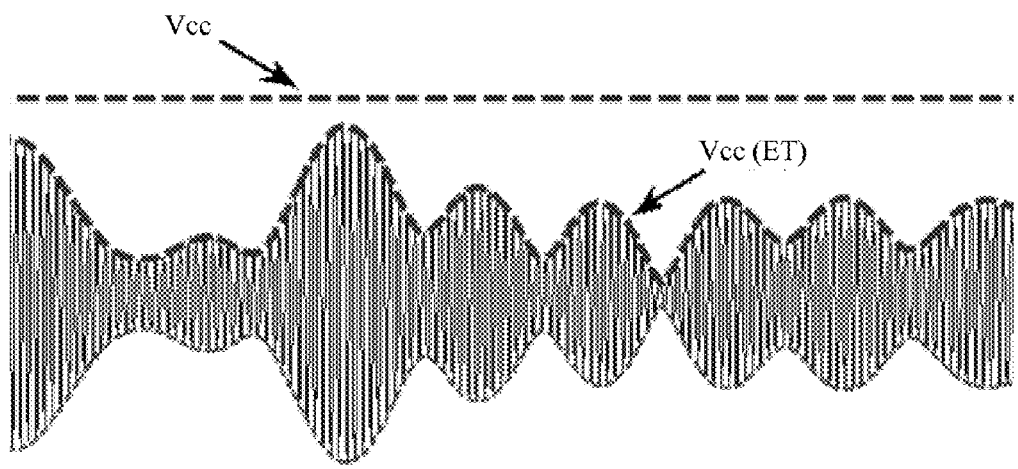
FIG. 2 is a schematic diagram of a change of a supply voltage of a PA when an ET technology is used according to the prior art.
Figure 3:
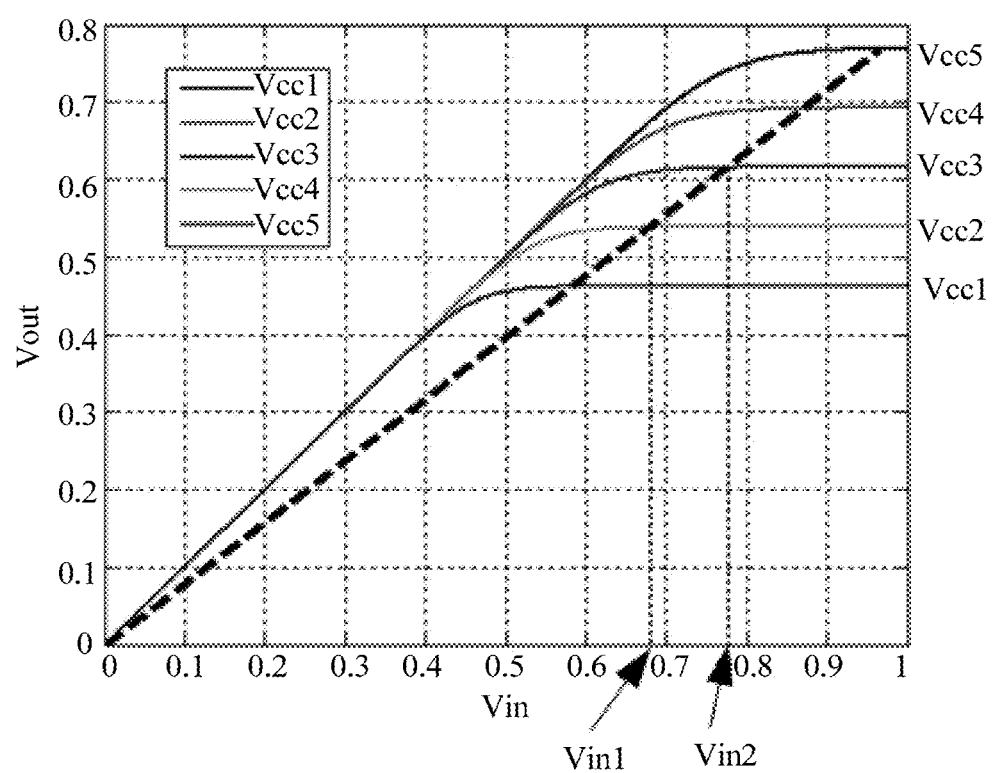
FIG. 3 is a schematic diagram of a relationship between a supply voltage and a gain that are of a PA according to the prior art.
Figure 4:
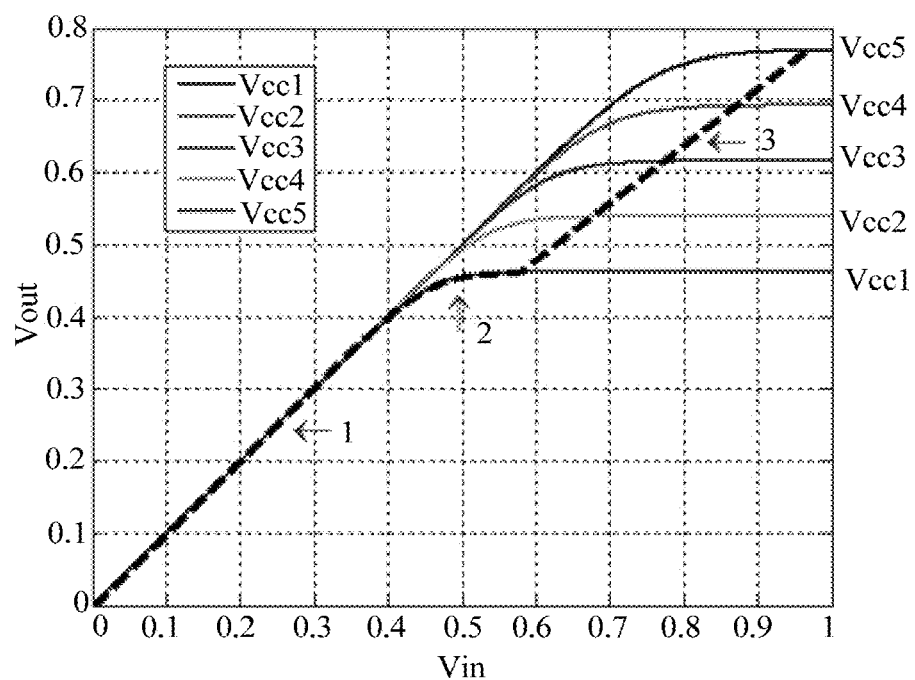
FIG. 4 is a schematic diagram of another relationship between a supply voltage and a gain that are of a PA according to the prior art.
Figure 5:
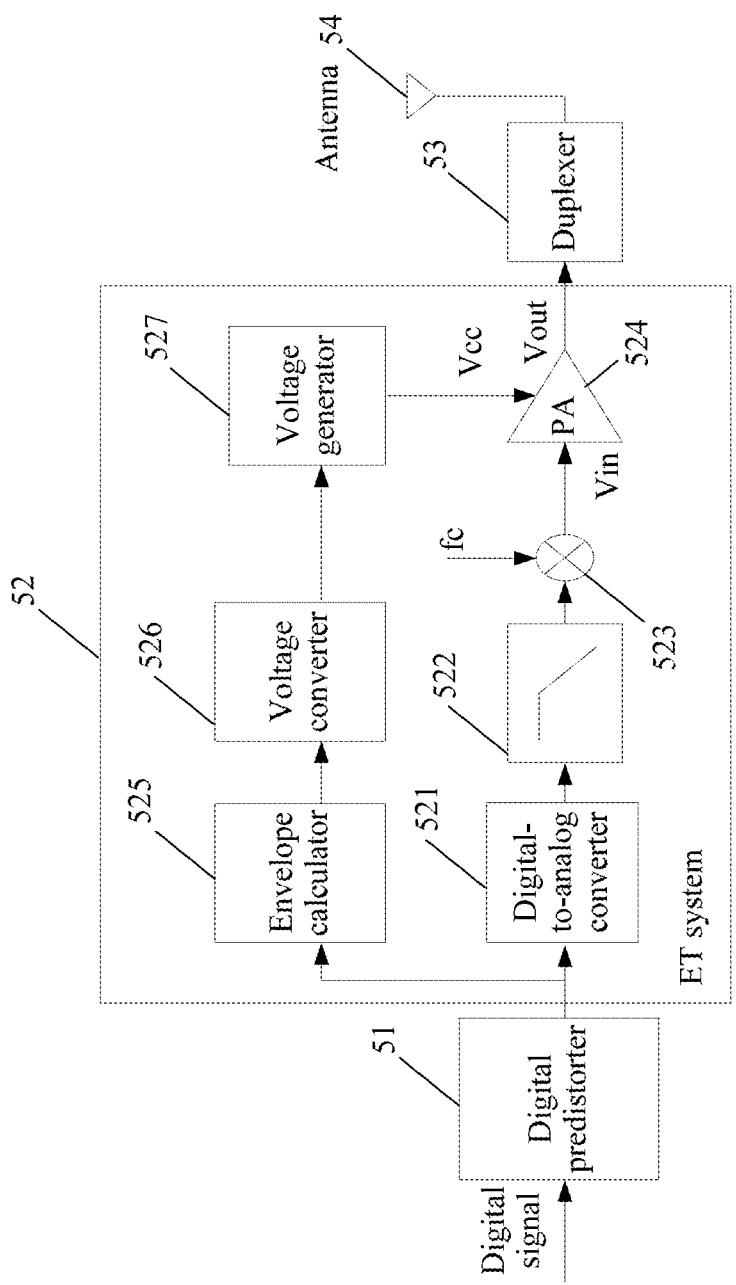
FIG. 5 is a schematic diagram of a structure of a radio frequency system based on digital predistortion in an ET mode according to the prior art.
Figures 6, 7:
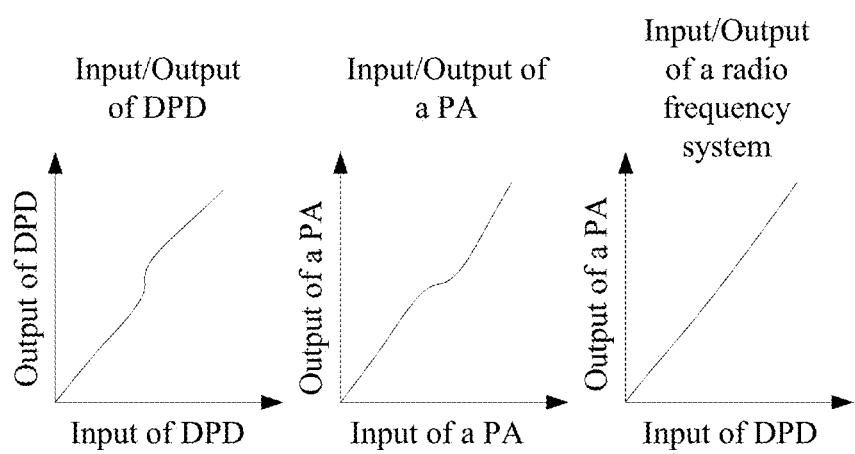
FIG. 6 is a schematic diagram of a correspondence between a supply voltage value of a PA and an envelope signal of an input signal in an ET mode according to the prior art.
FIG. 7 is a schematic diagram of relationships between respective input/output signal amplitudes of a digital predistorter, an ET system, and an entire system according to the prior art.

Under function of a predistortion gain of the digital predistorter 81 and an amplification gain of the power amplifier 524, a system gain of the radio frequency output signal relative to the digital signal is a constant, where the predistortion gain reflects a change of the predistortion signal relative to the digital signal, and the amplification gain reflects a change of the radio frequency output signal relative to the radio frequency input signal. For specific input/output relationships of the digital predistorter 81, the PA, and the entire system, refer to FIG. 7. The digital predistorter 81 may be a digital logic circuit, and the digital logic circuit executes, by using a digital logical operation, two digital signal processing manners shown in FIG. 8. The digital predistorter 81 uses different processing manners when the digital predistorter 81 outputs predistortion signals each of which is within a range of a different interval, which means that segmentation processing is performed on an entire output range. Compared with a processing circuit using a same manner, for example, a table searcher or a complex polynomial fitter used to simulate an entire process of digital predistortion processing, an implementation manner in this embodiment of the present disclosure is simpler, which helps reduce an implementation cost of the digital predistorter in addition to better implementing digital predistortion processing.

In addition, the digital predistorter 81 in this embodiment of the present disclosure may further restrain gain memory of the PA 524. The gain memory means that a gain of the PA 524 not only depends on a current input signal of the PA 524, but also is affected by an input signal of the PA 524 at a previous moment. The digital predistorter 81 uses different processing manners to output predistortion signals each of which is within a different value range. Compared with a digital predistorter using a same processing circuit to perform all operations, a difficulty of operation processing is reduced, and the gain memory of the PA in each processing manner is also reduced. Therefore, in this embodiment, a restraint effect on the gain memory of the PA is also achieved.

The predistortion signal output by the digital predistorter 81 is a digital domain signal that actually reflects a voltage amplitude value of the radio frequency input signal Vin of the PA 524. That is, after being processed by the digital-to-analog converter 521, the high-pass filter 522, and the frequency mixer 523, the predistortion signal changes from the digital domain signal to an analog domain signal and a frequency changes, so that the predistortion signal is amplified by the PA 524. Therefore, the predistortion signal is in essence a representation of the radio frequency input signal Vin in the digital domain, and the radio frequency input signal Vin is a representation of the predistortion signal in the analog domain. It can be understood that a measurement dimension of an analog domain signal may be a voltage with volt (V) or millivolt (mV) as a unit, and a digital domain signal is one or more binary bits. Therefore, when the predistortion signal output by the digital predistorter 81 is within the first interval, the radio frequency input signal Vin corresponding to the predistortion signal is also within the first interval. When the predistortion signal output by the digital predistorter 81 is within the second interval, the radio frequency input signal Vin corresponding to the predistortion signal is also within the second interval.

In an optional implementation manner, the power supply apparatus 520 includes: an envelope calculator 525, configured to receive the predistortion signal, and extract the envelope signal of the predistortion signal; a voltage converter 526, configured to receive the envelope signal from the envelope calculator, and convert the envelope signal into a digital voltage; and a voltage generator 527, configured to receive the digital voltage from the voltage converter, and convert the digital voltage into the supply voltage Vcc. Because the digital voltage is one or more binary bits in the digital domain, the digital voltage in essence indicates the actual supply voltage Vcc in the analog domain. The voltage generator 527 is actually a digital-to-analog converter, configured to convert the digital voltage in the digital domain into the supply voltage Vcc. The voltage converter 526 specifically converts the envelope signal into the digital voltage based on a lookup table algorithm. Specifically, the voltage converter 526 may include a lookup table similar to that shown in FIG. 6, and obtains, by executing the lookup table algorithm, a required digital voltage from the lookup table. Alternatively, the voltage converter 526 may also be a logical operation unit, and the logical operation unit performs digital logical operation processing on the envelope signal to obtain the digital voltage, without a need to use the lookup table algorithm.

In the radio frequency system shown in FIG. 8, each part of the ET system 52 may separately work in the digital domain or in the analog domain. For example, the envelope calculator 525 and the voltage converter 526 may be digital logic circuits. Because the voltage generator 527 and the digital-to-analog converter 521 implement conversion from a digital domain signal to an analog domain signal, the voltage generator 527 and the digital-to-analog converter 521 may be digital-analog hybrid circuits. The high-pass filter 522, the frequency mixer 523, and the PA 524 may be analog circuits, and work in the analog domain. Certainly, this embodiment is merely intended to illustrate an implementation solution for the ET system 52, and is not intended to limit the present disclosure. There are some alternative implementation manners in the foregoing embodiment. For example, at least a part of the high-pass filter 522 and the frequency mixer 523 may also be implemented by using the digital circuit.

Figure 10:
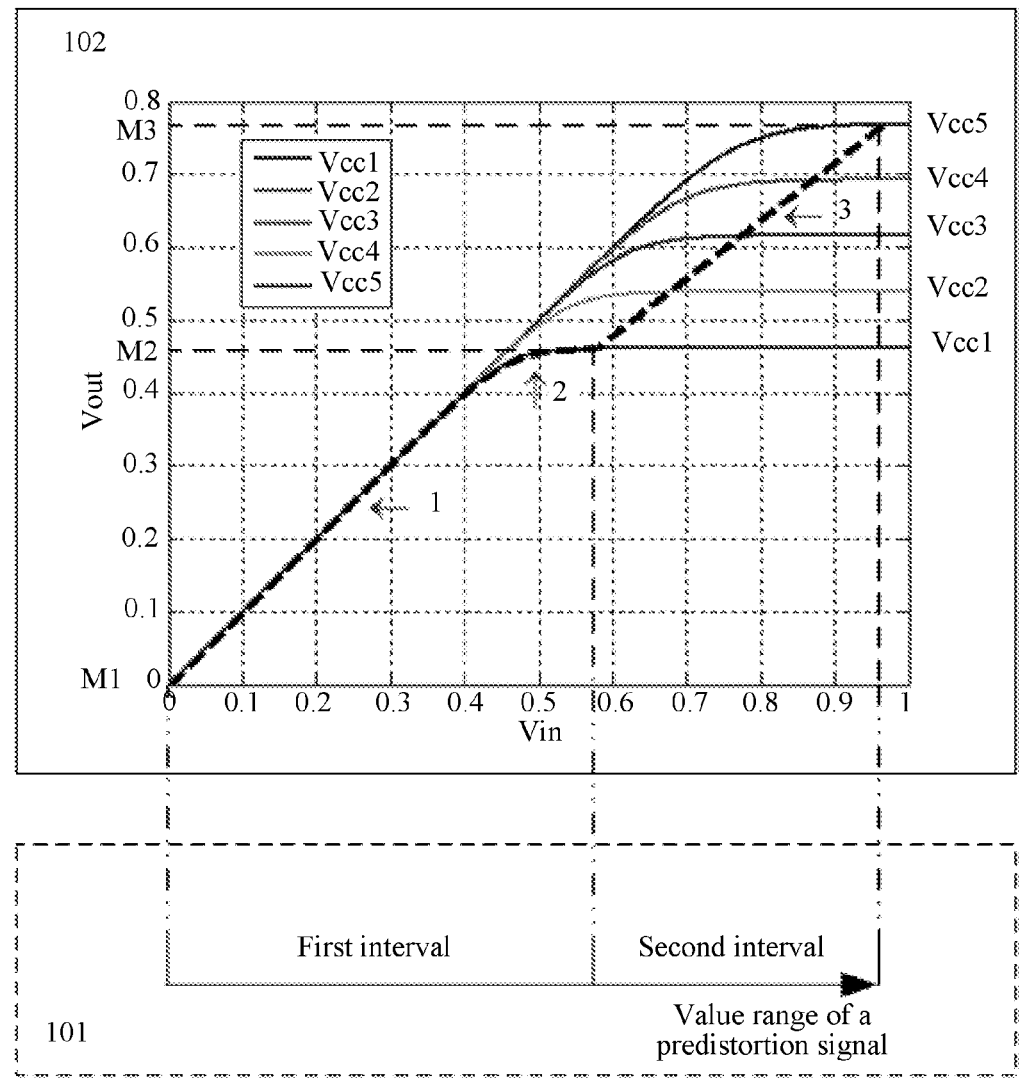
FIG. 10 is a schematic diagram of a working principle of a digital predistortion system according to an embodiment of the present disclosure.

The two intervals of the predistortion signal may be divided according to a working principle of the PA 524. A division manner is shown in FIG. 10. A relationship between a radio frequency input signal Vin and a radio frequency output signal Vout is shown by a thick dashed line in FIG. 10, where a block 102 is a schematic diagram showing a work area of a PA 524, and a block 101 shows a value range of a predistortion signal output by a digital predistorter 81. In the block 102, a horizontal axis represents the radio frequency input signal Vin, a vertical axis represents the radio frequency output signal Vout, and the Vin and the Vout are specifically measured by voltage whose unit may be volt, millivolt, or the like. Multiple solid curves corresponding to Vcc1 to Vcc5 reflect that an output signal of the PA changes with an input signal when a corresponding constant supply voltage is used. For example, a solid curve corresponding to Vcc1 shows an input/output signal relationship of the PA at the constant supply voltage Vcc1. There is a non-linear region in the solid curve. When an ET mode is used for working, the thick dashed line shows an input signal/output signal relationship of the PA in ET, that is, a gain of the PA. For an input signal Vin of a different amplitude, a corresponding Vcc is used as the supply voltage. There are multiple choices for the supply voltage, for example, a successive increase from Vcc1 to Vcc5, where Vcc1 may represent a minimum value of the supply voltage, and Vcc5 may represent a maximum value of the supply voltage. It can be seen from FIG. 10 that an input/output curve of the PA 524, that is, the thick dashed line, is divided into three parts with reference numerals 1, 2, and 3 respectively. These three parts may be divided into two segments, corresponding to a first interval and a second interval of the predistortion signal respectively. The part of the thick dashed line corresponding to the reference numeral 1 is a linear region of the PA 524, the part of the thick dashed line corresponding to the reference numeral 2 is a part of the non-linear region of the PA 524, and a segment of the thick dashed line corresponding to the reference numerals 1 and 2 together corresponds to the first interval. For example, this segment of the thick dashed line may correspond to the radio frequency input signal Vin whose range is from 0 V to 0.58 V along the horizontal axis. A supply voltage M2 that is used may be the minimum value Vcc1 or another constant voltage greater than Vcc1. This segment of the thick dashed line may correspond to the radio frequency output signal Vout whose range is from M1 (whose value is 0) to M2 along the vertical axis. A segment of the thick dashed line corresponding to the reference numeral 3 corresponds to the second interval and the second interval corresponds to a non-linear region of each Vcc. However, because the supply voltage is adjusted in the ET mode, a gain of the PA 524 corresponding to this segment of the thick dashed line is a constant. For example, for the second interval, a range of the radio frequency input signal Vin is from 0.58 V to 0.95 V. In this case, a range of the corresponding radio frequency output signal Vout is from M2 to M3. The value range of the predistortion signal is divided into two intervals, which implements segmentation processing of the digital predistorter 81 for different intervals. For an output value in each interval, the digital predistorter 81 may use different processing manners.

A gain of the entire digital predistortion system 80 is constant, and the gain is set to A0. The predistortion gain of the digital predistorter 81 is set to A1, and the amplification gain of the PA 524 is A2. The predistortion gain A1 reflects a change of the predistortion signal output by the digital predistorter 81 relative to a digital signal input into the digital predistorter 81, and the amplification gain A2 reflects a change of the radio frequency output signal Vout of the PA 524 relative to the radio frequency input signal Vin of the PA 524. In this embodiment of the present disclosure, A1×A2=A0, indicating that a predistortion operation that is performed by the digital predistorter 81 on the digital signal may compensate non-linearity of the gain of the PA 524, so that a final change of the radio frequency output signal Vout is linear, relative to the digital signal input into the digital predistorter 81. For details, refer to FIG. 7. When the PA 524 performs transformation with a gain of A2 on the radio frequency input signal Vin, the digital predistorter 81 performs transformation with a gain of A1 on the digital signal to obtain a digital domain signal of the radio frequency input signal Vin, that is, the predistortion signal. Therefore, a working manner of the digital predistorter 81 depends on the gain of the PA 524. For an output of the digital predistorter 81 in the first interval or in the second interval, the digital predistorter 81 uses different processing manners, and corresponding gains of the PA 524 are also different. Therefore, to determine a processing manner of the digital predistorter 81 is to determine the gain of the PA 524, that is, a slope of each segment of the thick dashed line in FIG. 10.

In an implementation manner, referring to FIG. 10, because the thick dashed line corresponding to the reference numeral 3 represents that the gain of the PA 524 is constant, the gain may be set to a second constant amplification gain A22. In this case, the digital predistorter 81 performs predistortion processing on the digital signal based on a second constant predistortion gain A12, which means that preamplification based on the second constant predistortion gain A12 is performed on the digital signal in the digital domain to obtain the predistortion signal whose output range is within the second interval. In FIG. 10, the thick dashed line corresponding to the reference numeral 1 represents that the gain of the PA 524 is constant, the thick dashed line corresponding to the reference numeral 2 represents that the gain of the PA 524 is not constant, and when the thick dashed lines corresponding to the reference numerals 1 and 2 as a whole correspond to the first interval, the gain of the PA 524 is still not constant. In this case, a first polynomial may be used to fit a processing process of the digital predistorter 81. There are multiple fitting polynomial manners, and reference may be made to an existing conventional solution. This embodiment provides only an implementation manner for reference. For example, an input and an output of the digital predistorter 81 may be presented by using the following first polynomial MP2:

$$Z(n) = \sum_{k=1, k=odd}^{K} \sum_{q=0}^{Q} a_{kq} \gamma(n-q) |\gamma(n-q)|^{k-1}, \text{ where}$$

Z(n) represents an output of the digital predistorter 81 at the $n^{th}$ moment; $a^{kq}$ is a polynomial coefficient, and for different values of k and q, the coefficient may be different; and y(n) represents an input of the digital predistorter 81 at the $n^{th}$ moment. The parameter q is a parameter used to eliminate memory of the PA 524, whose value may be from 0 to Q. k reflects a degree of processing, whose value is from 1 to K and is an odd number (odd). Values of K and Q may be set by a person skilled in the art according to an actual application requirement or according to actual experience, for example, may be set taking accuracy and complexity of signal processing into consideration. Larger values of K and Q lead to an increase in both processing accuracy and complexity. By using the related polynomial MP2, a predistortion signal that is of the digital predistorter 81 and whose output range is within the first interval may be fitted. Because the first polynomial MP2 can better fit an input/output relationship of the digital predistorter 81 whose gain is variable, the variable gain of the digital predistorter 81 can be implemented, so that the variable gain of the digital predistorter 81 matches a variable gain of the PA, and a linear gain of the entire radio frequency system is implemented.

In an alternative manner of the foregoing implementation manner, the second constant amplification gain A22 may be replaced with a variable gain A22', which may be completed by setting the voltage converter 526 (for example, setting a value in a lookup table, so that the lookup table is no longer a linear table), so that the thick dashed line corresponding to the reference numeral 3 is no longer linear. Specifically, a shape of the thick dashed line corresponding to the reference numeral 3 may be made similar to shapes of the thick dashed lines corresponding to the reference numerals 1 and 2. In this case, the digital predistorter 81 may use a second polynomial MP3 to perform a fitting to implement a predistortion digital whose output range is within the second interval. There may be multiple implementation manners for the second polynomial MP3. A simple implementation manner is to use a form similar to the first polynomial MP2. For example, transformation may be performed on MP2, so that MP3=c× MP2+d, and therefore MP3 is obtained based on MP2, where c and d are a slope and a deviation of MP3 relative to MP2, and values of c and d may be set by a person skilled in the art according to an actual use requirement or experience.

Figure 11:
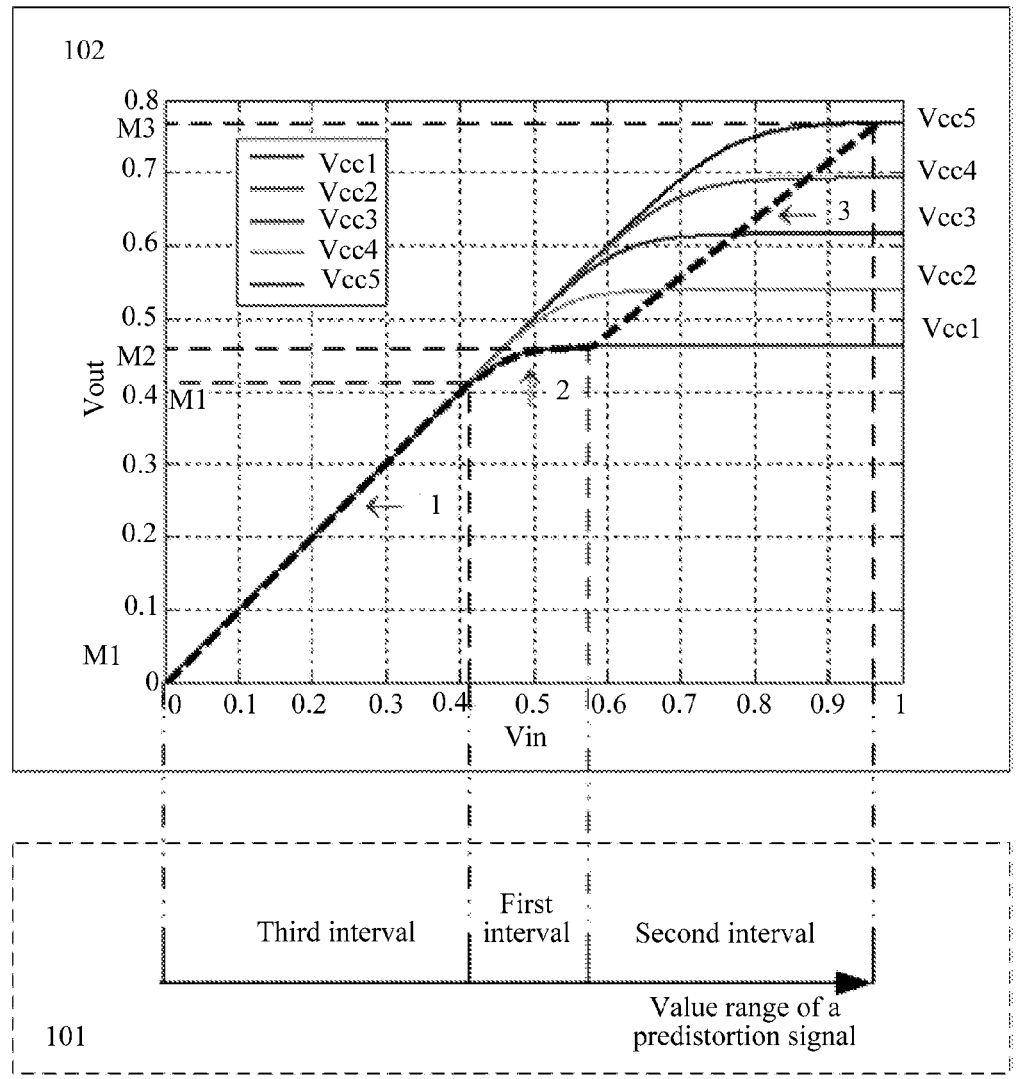
FIG. 11 is a schematic diagram of a working principle of another digital predistortion system according to an embodiment of the present disclosure.

In another optional implementation manner, the digital predistorter 81 may use different processing manners for the thick dashed lines with the reference numeral 1, reference numeral 2, and reference numeral 3. That is, the entire thick dashed line is divided into three segments according to a reference numeral. In this case, the multiple processing manners further include a third processing manner. As shown in FIG. 11, the reference numeral 1 corresponds to a third interval of a predistortion signal, the reference numeral 2 corresponds to a first interval of the predistortion signal, and the reference numeral 3 corresponds to a second interval of the predistortion signal. In a vertical axis direction, a radio frequency output signal Vout corresponding to the reference numeral 1 is from 0 to M1 (M1 is greater than 0), a radio frequency output signal Vout corresponding to the reference numeral 2 is from M1 to M2, and a radio frequency output signal Vout corresponding to the reference numeral 3 is from M2 to M3. Similar to the previous implementation manner, for the thick dashed line corresponding to the reference numeral 3, a digital predistorter 81 may use a second constant predistortion gain A12 or a second polynomial MP3 to perform a fitting to implement a predistortion signal whose output range is within the second interval. For the thick dashed line corresponding to the reference numeral 2, the digital predistorter 81 may use a first polynomial MP2 to perform a fitting to implement a predistortion signal whose output range is within the first interval. The digital predistorter 81 may use a first constant predistortion gain A11 to process a digital signal to obtain a predistortion signal whose output range is within the third interval.

Figure 12:
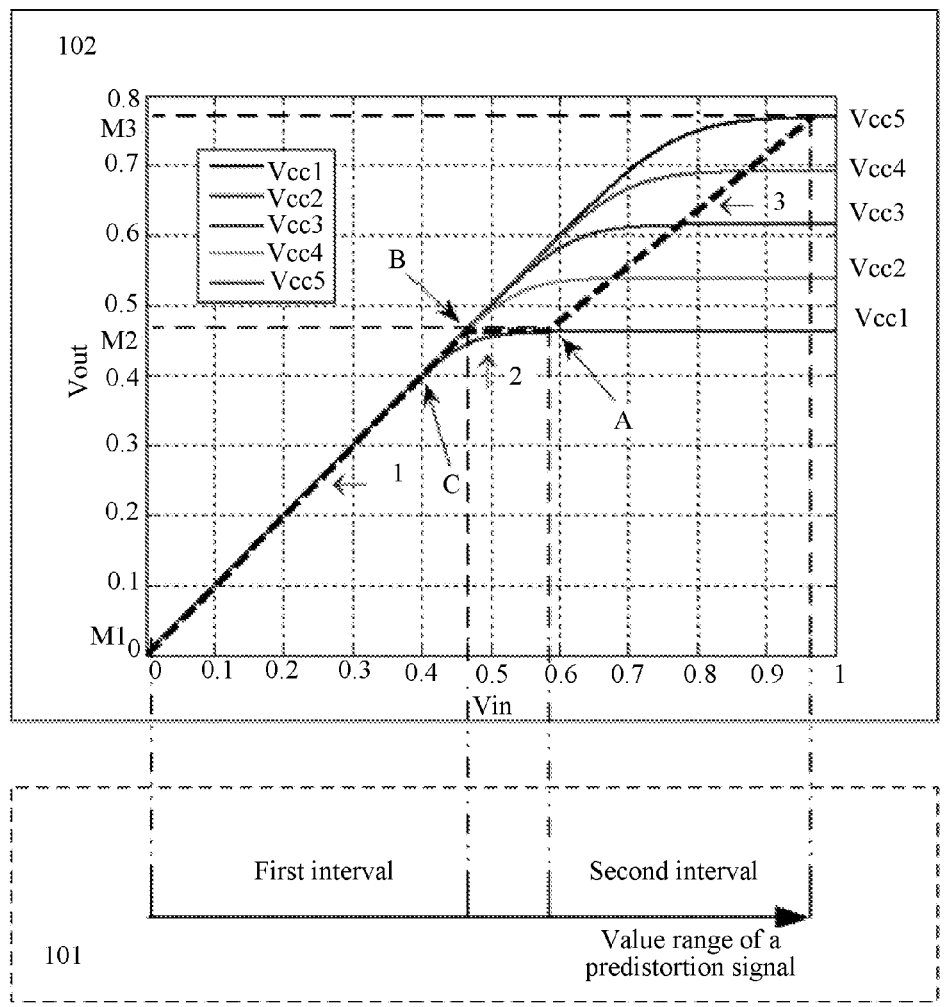
FIG. 12 is a schematic diagram of a working principle of another preferred digital predistortion system according to an embodiment of the present disclosure.

In a preferred implementation manner, two thick dashed line segments of a linear gain may be used to simulate an input/output relationship of a PA 524. As shown in FIG. 12, thick dashed line parts corresponding to reference numerals 1 and 3 correspond to two discontinuous intervals along a horizontal axis, which respectively correspond to a first interval and a second interval of a predistortion signal, where the first interval and the second interval are not adjacent. Along a vertical axis, a radio frequency output signal Vout corresponding to the reference numeral 1 is from M1 (whose value is 0) to M2, and a radio frequency output signal Vout corresponding to the reference numeral 3 is from M2 to M3. The thick dashed line corresponding to the reference numeral 2 is no longer used. Therefore, of the two thick dashed line parts corresponding to the reference numerals 1 and 3 are both simulated by using a linear gain. A gain of a PA 524 corresponding to the thick dashed line corresponding to the reference numeral 1 is a first constant amplification gain A21. In this case, a predistortion gain of a digital predistorter 81 is a first constant predistortion gain A11. A gain of the PA 524 corresponding to the thick dashed line corresponding to the reference numeral 3 is a second constant amplification gain A22. In this case, a predistortion gain of the digital predistorter 81 is a second constant predistortion gain A12. By using the simulation manner, gains corresponding to two output intervals of the PA are both linear. Therefore, when the digital predistorter 81 outputs predistortion signals for the two intervals, the constant gains A11 and A12 may be separately used to perform predistortion processing, and two obtained intervals are not adjacent. Therefore, no processing needs to be performed on a non-linear thick dashed line corresponding to the reference numeral 2, saving a fitting polynomial process, so that an algorithm used for processing is further simplified, achieving a better effect than that of the previous implementation manner. It may be understood that the two gains A11 and A12 are generally different. For example, the first constant predistortion gain A11 is less than the second constant predistortion gain A12, and correspondingly, the first constant amplification gain A21 is greater than the second constant amplification gain A22, which is not limited in this embodiment.

Figure 13:
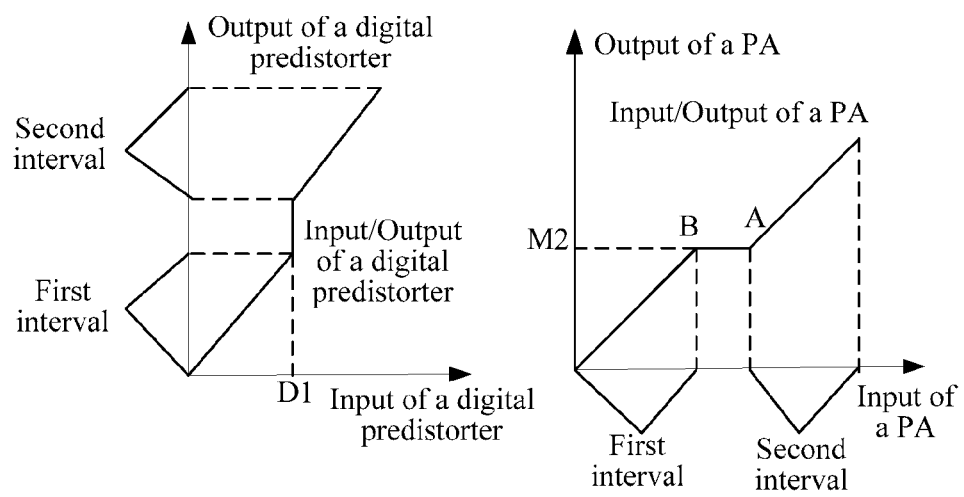
FIG. 13 is a schematic diagram of working principles of a digital predistorter and a PA in a preferred implementation manner according to an embodiment of the present disclosure.

For the preferred implementation manner, referring to FIG. 13, an accompanying drawing on the left describes a schematic diagram of an input/output relationship of a digital predistorter 81, and an accompanying drawing on the right describes a schematic diagram of an input/output relationship of a PA 524. It may be considered that FIG. 13 is a variation and optimization of FIG. 7. For an input change of the digital predistorter 81, there are two discontinuous intervals for an output of the digital predistorter 81. After being converted to an analog domain, the two related intervals are mapped to two discontinuous input signal intervals of the PA 524. When an input of the digital predistorter 81 is D1, an output of the PA 524 is M2. In the accompanying drawing on the right, a part between a node A and a node B is not fitted or processed. Under function of a gain that the digital predistorter 81 uses in predistortion processing and a gain of the PA 524, a total gain between the input of the digital predistorter 81 and the output of the PA 524 remains as a constant, which is like an accompanying drawing on the rightmost side of FIG. 7.

It may be understood that the digital predistortion system 80 may further include: a memory (which is not shown in the figure), configured to store a polynomial coefficient. The digital predistorter 81 is configured to read the polynomial coefficient from the memory, and apply the polynomial coefficient to the first polynomial MP2 fitting or the second polynomial MP3 fitting, where the polynomial coefficient may be $a_{kq}$, K, Q, or the like mentioned in the previous embodiment. In this embodiment of the present disclosure, different predistortion processing manners are used for different output intervals of the digital predistorter 81. Even if the first polynomial MP2 or the second polynomial MP3 needs to be used to perform a fitting, a structure of each polynomial is simpler compared with a solution in which only one polynomial is used to fit an entire algorithm of the digital predistorter 81. Therefore, compared with a conventional solution, the memory does not need to store a large quantity of polynomial coefficients, saving storage space. Stored polynomial coefficients are reduced, which is more helpful for updating the polynomial coefficients in real time. In addition, the memory may further be configured to store endpoints of each segment or interval described in the previous embodiment, for example, values of M1, M2, and M3 described above, so that the digital predistorter 81 reads, from the memory, the values of the endpoints M1, M2, and M3, and performs predistortion processing in each segment based on the endpoints.

In a process of designing a related circuit, a person skilled in the art may set, according to an actual application requirement (for example, considering multiple factors such as a technique used for manufacturing the circuit, a range of a supply voltage, and complexity of implementing the circuit) the values of the endpoints M1, M2, and M3 and polynomial coefficients of the first polynomial MP2 and of the second polynomial MP3 that are stored in the memory, and may further set a voltage converter 526 according to a storage value of the memory. For example, if the voltage converter 526 includes a lookup table, a value in the lookup table may be set corresponding to the storage value in the memory, so that the voltage converter 526 obtains, by searching the lookup table, a digital voltage corresponding to an envelope signal, implementing that an output value of the digital voltage matches a work interval of the PA 524. Then a power supply apparatus 520 may provide a required supply voltage for the PA 524, which implements working in an ET mode. As described above, for thick dashed lines corresponding to reference numerals 1 and 2, the power supply apparatus 520 may provide a constant voltage for the PA 524, which is generally a minimum value Vcc1 of the supply voltage or a value greater than the Vcc1. For a thick dashed line corresponding to a reference numeral 3, the power supply apparatus 520 may provide a variable voltage in the ET mode for the PA 524, and a maximum value of the variable voltage does not exceed a maximum value Vcc5 of the supply voltage. For a specific implementation process of an ET technology, refer to an introduction of the prior art, which is not described in detail in this embodiment.

By using only FIG. 12 as an example, the following briefly describes how to set values of endpoints of a first interval and a second interval. These settings may be implemented by a person skilled in the art in a stage of designing or developing a circuit of a digital predistortion system 80 or debugging the circuit. Vin-Vout curves (five solid curves shown in FIG. 12) of a PA in the case of multiple groups of Vcc (for example, Vcc1 to Vcc5) may be first tested, where Vcc1 corresponds to a lowest supply voltage of the PA and Vcc5 is a highest supply voltage. M1 may be 0, and M3 is the maximum value Vcc5 of the supply voltage or is a value less than Vcc5. Lookup table values corresponding to a first thick dashed line segment with a reference numeral 1 and a third thick dashed line segment with a reference numeral 3 are separately set in a voltage converter 526. Afterwards, a point A is set to obtain a value of M2 corresponding to the point A along a vertical axis, where M2 generally corresponds to Vcc1 or another value greater than Vcc1 along the vertical axis. According to the point A, a point B is obtained in the first thick dashed line segment, the point B and the point A correspond to a same radio frequency output signal M2 along the vertical axis, and the point B is an intersecting point between the first thick dashed line segment with the reference numeral 1 and a horizontal line passing through A. According to the point B, a supply voltage VccX corresponding to the first thick dashed line segment is obtained, where VccX is generally Vcc1 or is greater than Vcc1. A point C is a demarcation point for a change from a linear region to a non-linear region when the PA works at the minimum supply voltage Vcc1. When a signal amplitude of a radio frequency output signal is less than that of the point B and is greater than that of the point C, the VccX may always be used. Alternatively, in a location in which the signal amplitude of the radio frequency output signal is less than that of the point B and is greater than that of the point C, a constant voltage may not be applied, but a variable voltage is used, which is not limited in this embodiment. According to coordinates of the point A and the point B along a horizontal axis, endpoints of a first interval and a second interval are obtained. In this way, a person skilled in the art may obtain the first interval and the second interval according to the endpoints of the first interval and the second interval, so that an output range of the digital predistorter 81 is divided into two segments.

The digital predistorter 81 mentioned in this embodiment of the present disclosure may be formed by a digital logic circuit. The digital logic circuit may include a large quantity of digital logical gate arrays used for implementing operation processing. The digital logical gate arrays implement, by using digital logical operation processing, predistortion processing at the constant gain or predistortion processing that is at a non-constant gain and based on a fitting polynomial mentioned above. The digital predistorter 81 may include a digital processing circuit corresponding to each processing manner. The digital processing circuit corresponding to each processing manner may be independent of each other, or it may be that some units in a part of digital processing circuits and another part of digital processing circuits are reused. For example, most parts of a circuit 2 for performing a second polynomial MP3 fitting may be the same as a circuit 1 for performing a first polynomial MP2 fitting, and the circuit 2 further includes an algorithm circuit for performing transformation on MP2 to obtain MP3. As described in the previous embodiment, the algorithm circuit implements the following calculation: $MP3=c\times MP2+d$, where c and d are a slope and a deviation of MP3 relative to MP2.

It should be noted that "the first" or "the second" mentioned in each embodiment provided by the present disclosure is only for distinguishing different units or modules, and does not have a special technical implication itself.

In addition, "coupling" between different elements mentioned in the embodiments should be understood as a connection in any form, for example, a connection by using a conducting wire, or an indirect connection by using one or more other elements instead of only a direct connection by using a conducting wire.

It may be understood that the foregoing radio frequency system may be applied to various wireless communications devices, for example, a base station, a relay station, a wireless terminal, an FM (Frequency Modulation) device, a Bluetooth device, a WiFi (wireless fidelity) device, or the like. Application of the apparatus is not limited by a wireless communications protocol, and may be widely applied to various wireless communications protocols, for example, the LTE (Long Term Evolution), WCDMA (Wideband Code Division Multiple Access), WiFi, Bluetooth or GSM (Global System for Mobile Communications) standard. When the radio frequency system is applied to a wireless terminal, a form of the terminal may be a laptop computer, a tablet computer, a smartphone, a data card, a walkie-talkie, or the like, which is not limited in the embodiments.

It may be understood that in addition to implementing the digital predistorter 81 by using a digital logic circuit, the digital logic circuit may be replaced with a general purpose processor that executes a software program to implement a process of predistortion processing described in the previous embodiments. A specific processing process is not described herein again. Because the general purpose processor may execute a software computer program to implement a predistortion processing function of the digital predistorter 81, the software computer program may be stored in a computer-readable storage medium, and may include several instructions for enabling a computer device (which may be a processor in the laptop computer, the tablet computer, the smartphone, the base station, or the like) to implement an algorithm function or an execution method that are of the digital predistorter 81 mentioned in the embodiments of the present disclosure. The foregoing storage medium includes: any medium that can store program code, such as a USB flash drive, a removable hard disk, a read-only memory (ROM), a random access memory (RAM), a magnetic disk, or an optical disc.

The foregoing are merely some embodiments of the present disclosure. A person skilled in the art may make various modifications or variations to the present disclosure without departing from the spirit and scope of the present disclosure. A person of ordinary skill in the art may understand that in the case of no conflict, the embodiments or features of different embodiments may be mutually combined to form a new embodiment.

What is claimed is:

1. A digital predistortion system based on envelope tracking, comprising:
   a digital predistorter, configured to receive a digital signal, and perform predistortion processing on the digital signal to obtain a predistortion signal;
   a digital-to-analog converter, configured to receive the predistortion signal, and convert the predistortion signal into an analog signal;
   a frequency mixer, configured to receive the analog signal from the digital-to-analog converter, and modulate the analog signal to obtain a radio frequency input signal;
   a power amplifier, configured to receive a supply voltage, and amplify the radio frequency input signal under function of the supply voltage to obtain a radio frequency output signal; and
   a power supply apparatus, configured to receive the predistortion signal, and generate the supply voltage based on the predistortion signal; wherein
   the digital predistorter is capable of working in multiple processing manners, wherein the multiple processing manners comprise a first processing manner and a second processing manner being different from the first processing manner;
   wherein a first value range of the predistortion signal that is obtained when the digital predistorter works in the first processing manner is within a first interval, and a second value range of the predistortion signal that is obtained when the digital predistorter works in the second processing manner is within a second interval;
   the first interval corresponds to a first amplitude range of the radio frequency output signal, the second interval corresponds to a second amplitude range of the radio frequency output signal, the first amplitude range is from M1 to M2, and the second amplitude range is from M2 to M3; and
   M3 is greater than M2 and M3 is less than or equal to a maximum value of the supply voltage, M2 is greater than M1 and M2 is greater than or equal to a minimum value of the supply voltage, the minimum value of the supply voltage is greater than 0, and M1 is a positive number greater than or equal to 0 and is less than the minimum value of the supply voltage;
   when the digital predistorter obtains the predistortion signal whose value range is within the first interval, a value of the supply voltage generated by the power supply apparatus is M2;
   when the digital predistorter obtains the predistortion signal whose value range is within the second interval, a change of the supply voltage generated by the power supply apparatus tracks a change of an envelope signal of the predistortion signal, and the power amplifier works in a non-linear region; and
   under function of a predistortion gain of the digital predistorter and an amplification gain of the power amplifier, a system gain of the radio frequency output signal relative to the digital signal is a constant, wherein the predistortion gain reflects a change of the predistortion signal relative to the digital signal, and the amplification gain reflects a change of the radio frequency output signal relative to the radio frequency input signal.

2. The digital predistortion system according to claim 1, wherein M1 is 0;
   in the first processing manner, the predistortion gain is a first constant predistortion gain, the power amplifier works in a linear region, the amplification gain is a first constant amplification gain, and the system gain is produced under function of the first constant predistortion gain and the first constant amplification gain; and
   in the second processing manner, the predistortion gain is a second constant predistortion gain, the amplification gain is a second constant amplification gain, and the system gain is produced under function of the second constant predistortion gain and the second constant amplification gain.

3. The digital predistortion system according to claim 1, wherein M1 is 0;
   in the first processing manner, the digital predistorter uses a first fitting polynomial manner to perform predistortion processing on the digital signal to obtain the predistortion signal, the predistortion gain is a first variable predistortion gain, the power amplifier works in a linear region or in the non-linear region, the amplification gain is a first variable amplification gain, and the system gain is produced under function of the first variable predistortion gain and the first variable amplification gain; and
   in the second processing manner, the predistortion gain is a second constant predistortion gain, the amplification gain is a second constant amplification gain, and the system gain is produced under function of the second constant predistortion gain and the second constant amplification gain.

4. The digital predistortion system according to claim 3, further comprising: a memory, configured to store a polynomial coefficient, wherein
   the digital predistorter is configured to read the polynomial coefficient from the memory, and apply the polynomial coefficient to the first fitting polynomial.

5. The digital predistortion system according to claim 1, wherein M1 is 0;
   in the first processing manner, the digital predistorter uses a first fitting polynomial manner to perform predistortion processing on the digital signal to obtain the predistortion signal, the predistortion gain is a first variable predistortion gain, the power amplifier works in a linear region or in the non-linear region, the amplification gain is a first variable amplification gain, and the system gain is produced under function of the first variable predistortion gain and the first variable amplification gain; and in the second processing manner, the digital predistorter uses a second fitting polynomial manner to perform predistortion processing on the digital signal to obtain the predistortion signal, the predistortion gain is a second variable predistortion gain, the amplification gain is a second variable amplification gain, and the system gain is produced under function of the second variable predistortion gain and the second variable amplification gain.

6. The digital predistortion system according to claim 5, further comprising: a memory, configured to store a polynomial coefficient, wherein the digital predistorter is configured to read the polynomial coefficient from the memory, and apply the polynomial coefficient to the first fitting polynomial and the second fitting polynomial.

7. The digital predistortion system according to claim 1, wherein M1 is greater than 0; the multiple processing manners comprise a third processing manner;

a value range of the predistortion signal that is obtained when the digital predistorter works in the third processing manner is within a third interval;

the third interval corresponds to a third amplitude range of the radio frequency output signal, and the third amplitude range is from 0 to M1; and when the digital predistorter obtains the predistortion signal whose value range is within the third interval, the value of the supply voltage generated by the power supply apparatus is M2;

in the first processing manner, the digital predistorter uses a first fitting polynomial manner to perform predistortion processing on the digital signal to obtain the predistortion signal, the predistortion gain is a first variable predistortion gain, the power amplifier works in the non-linear region, the amplification gain is a first variable amplification gain, and the system gain is produced under function of the first variable predistortion gain and the first variable amplification gain;

in the second processing manner, the predistortion gain is a second constant predistortion gain, the amplification gain is a second constant amplification gain, and the system gain is produced under function of the second constant predistortion gain and the second constant amplification gain; and in the third processing manner, the predistortion gain is a first constant predistortion gain, the power amplifier works in a linear region, the amplification gain is a first constant amplification gain, and the system gain is produced under function of the first constant predistortion gain and the first constant amplification gain.

8. The digital predistortion system according to claim 1, wherein M1 is greater than 0; the multiple processing manners comprise a third processing manner;

a value range of the predistortion signal that is obtained when the digital predistorter works in the third processing manner is within a third interval;

the third interval corresponds to a third amplitude range of the radio frequency output signal, and the third amplitude range is from 0 to M1; and when the digital predistorter obtains the predistortion signal whose value range is within the third interval, the value of the supply voltage generated by the power supply apparatus is M2;

in the first processing manner, the digital predistorter uses a first fitting polynomial manner to perform predistortion processing on the digital signal to obtain the predistortion signal, the predistortion gain is a first variable predistortion gain, the power amplifier works in the non-linear region, the amplification gain is a first variable amplification gain, and the system gain is produced under function of the first variable predistortion gain and the first variable amplification gain;

in the second processing manner, the digital predistorter uses a second fitting polynomial manner to perform predistortion processing on the digital signal to obtain the predistortion signal, the predistortion gain is a second variable predistortion gain, the amplification gain is a second variable amplification gain, and the system gain is produced under function of the second variable predistortion gain and the second variable amplification gain; and in the third processing manner, the predistortion gain is a first constant predistortion gain, the power amplifier works in a linear region, the amplification gain is a first constant amplification gain, and the system gain is produced under function of the first constant predistortion gain and the first constant amplification gain.

9. The digital predistortion system according to claim 1, wherein the power supply apparatus comprises:

an envelope calculator, configured to receive the predistortion signal, and extract the envelope signal of the predistortion signal;

a voltage converter, configured to receive the envelope signal from the envelope calculator, and convert the envelope signal into a digital voltage; and a voltage generator, configured to receive the digital voltage from the voltage converter, and convert the digital voltage into the supply voltage.

10. The digital predistortion system according to claim 9, wherein the voltage converter is configured to convert the envelope signal into the digital voltage based on a lookup table algorithm.

11. The digital predistortion system according to claim 1, further comprising: a high-pass filter, coupled between the digital-to-analog converter and the frequency mixer, and configured to filter out noise in the analog signal before the frequency mixer receives the analog signal.

12. The digital predistortion system according to claim 1, wherein the digital predistorter is a digital logic circuit.

13. A radio frequency system, wherein the radio frequency system comprises a digital predistortion system, a duplexer and an antenna;

wherein the digital predistortion system comprises:

a digital predistorter, configured to receive a digital signal, and perform predistortion processing on the digital signal to obtain a predistortion signal;

a digital-to-analog converter, configured to receive the predistortion signal, and convert the predistortion signal into an analog signal;

a frequency mixer, configured to receive the analog signal from the digital-to-analog converter, and modulate the analog signal to obtain a radio frequency input signal;

a power amplifier, configured to receive a supply voltage, and amplify the radio frequency input signal under function of the supply voltage to obtain a radio frequency output signal; and a power supply apparatus, configured to receive the predistortion signal, and generate the supply voltage based on the predistortion signal; wherein the digital predistorter is capable of working in multiple processing manners, wherein the multiple processing manners comprise a first processing manner and a second processing manner being different from the first processing manner;

wherein a first value range of the predistortion signal that is obtained when the digital predistorter works in the first processing manner is within a first interval, and a second value range of the predistortion signal that is obtained when the digital predistorter works in the second processing manner is within a second interval;

the first interval corresponds to a first amplitude range of the radio frequency output signal, the second interval corresponds to a second amplitude range of the radio frequency output signal, the first amplitude range is from M1 to M2, and the second amplitude range is from M2 to M3; and M3 is greater than M2 and M3 is less than or equal to a maximum value of the supply voltage, M2 is greater than M1 and M2 is greater than or equal to a minimum value of the supply voltage, the minimum value of the supply voltage is greater than 0, and M1 is a positive number greater than or equal to 0 and is less than the minimum value of the supply voltage;

when the digital predistorter obtains the predistortion signal whose value range is within the first interval, a value of the supply voltage generated by the power supply apparatus is M2;

when the digital predistorter obtains the predistortion signal whose value range is within the second interval, a change of the supply voltage generated by the power supply apparatus tracks a change of an envelope signal of the predistortion signal, and the power amplifier works in a non-linear region; and under function of a predistortion gain of the digital predistorter and an amplification gain of the power amplifier, a system gain of the radio frequency output signal relative to the digital signal is a constant, wherein the predistortion gain reflects a change of the predistortion signal relative to the digital signal, and the amplification gain reflects a change of the radio frequency output signal relative to the radio frequency input signal;

wherein the duplexer is configured to receive the radio frequency output signal from the power amplifier, and couple the radio frequency output signal to an antenna; and wherein the antenna is configured to transmit the radio frequency output signal.

14. The radio frequency system according to claim 13, wherein M1 is 0;
in the first processing manner, the predistortion gain is a first constant predistortion gain, the power amplifier works in a linear region, the amplification gain is a first constant amplification gain, and the system gain is produced under function of the first constant predistortion gain and the first constant amplification gain; and
in the second processing manner, the predistortion gain is a second constant predistortion gain, the amplification gain is a second constant amplification gain, and the system gain is produced under function of the second constant predistortion gain and the second constant amplification gain.

15. The radio frequency system according to claim 13, wherein M1 is 0;
in the first processing manner, the digital predistorter uses a first fitting polynomial manner to perform predistortion processing on the digital signal to obtain the predistortion signal, the predistortion gain is a first variable predistortion gain, the power amplifier works in a linear region or in the non-linear region, the amplification gain is a first variable amplification gain, and the system gain is produced under function of the first variable predistortion gain and the first variable amplification gain; and
in the second processing manner, the predistortion gain is a second constant predistortion gain, the amplification gain is a second constant amplification gain, and the system gain is produced under function of the second constant predistortion gain and the second constant amplification gain.

16. The radio frequency system according to claim 13, wherein M1 is 0;
in the first processing manner, the digital predistorter uses a first fitting polynomial manner to perform predistortion processing on the digital signal to obtain the predistortion signal, the predistortion gain is a first variable predistortion gain, the power amplifier works in a linear region or in the non-linear region, the amplification gain is a first variable amplification gain, and the system gain is produced under function of the first variable predistortion gain and the first variable amplification gain; and
in the second processing manner, the digital predistorter uses a second fitting polynomial manner to perform predistortion processing on the digital signal to obtain the predistortion signal, the predistortion gain is a second variable predistortion gain, the amplification gain is a second variable amplification gain, and the system gain is produced under function of the second variable predistortion gain and the second variable amplification gain.

17. The radio frequency system according to claim 13, wherein M1 is greater than 0; the multiple processing manners comprise a third processing manner;
a value range of the predistortion signal that is obtained when the digital predistorter works in the third processing manner is within a third interval; the third interval corresponds to a third amplitude range of the radio frequency output signal, and the third amplitude range is from 0 to M1; and when the digital predistorter obtains the predistortion signal whose value range is within the third interval, the value of the supply voltage generated by the power supply apparatus is M2;
in the first processing manner, the digital predistorter uses a first fitting polynomial manner to perform predistortion processing on the digital signal to obtain the predistortion signal, the predistortion gain is a first variable predistortion gain, the power amplifier works in the non-linear region, the amplification gain is a first variable amplification gain, and the system gain is produced under function of the first variable predistortion gain and the first variable amplification gain;
in the second processing manner, the predistortion gain is a second constant predistortion gain, the amplification gain is a second constant amplification gain, and the system gain is produced under function of the second constant predistortion gain and the second constant amplification gain; and in the third processing manner, the predistortion gain is a first constant predistortion gain, the power amplifier works in a linear region, the amplification gain is a first constant amplification gain, and the system gain is produced under function of the first constant predistortion gain and the first constant amplification gain.

18. A digital predistortion method based on envelope tracking, comprising:

receiving a digital signal, and performing predistortion processing on the digital signal to obtain a predistortion signal;

converting the predistortion signal into an analog signal;

modulating the analog signal to obtain a radio frequency input signal;

generating a supply voltage based on the predistortion signal; and amplifying the radio frequency input signal under function of the supply voltage to obtain a radio frequency output signal; wherein the performing predistortion processing on the digital signal to obtain a predistortion signal comprises: using multiple processing manners to perform predistortion processing on the digital signal to obtain the predistortion signal, wherein: the multiple processing manners comprise a first processing manner and a second processing manner being different from the first processing manner;

wherein a first value range of the predistortion signal that is obtained when the first processing manner is used is within a first interval, and a second value range of the predistortion signal that is obtained when a digital predistorter uses the second processing manner is within a second interval;

the first interval corresponds to a first amplitude range of the radio frequency output signal, the second interval corresponds to a second amplitude range of the radio frequency output signal, the first amplitude range is from M1 to M2, and the second amplitude range is from M2 to M3; and M3 is greater than M2 and M3 is less than or equal to a maximum value of the supply voltage, M2 is greater than M1 and M2 is greater than or equal to a minimum value of the supply voltage, the minimum value of the supply voltage is greater than 0, and M1 is a positive number greater than or equal to 0 and is less than the minimum value of the supply voltage;

when the predistortion signal whose value range is within the first interval is obtained, a value of the supply voltage is M2;

when the predistortion signal whose value range is within the second interval is obtained, a change of the supply voltage tracks a change of an envelope signal of the predistortion signal; and under function of a predistortion gain and an amplification gain, a system gain of the radio frequency output signal relative to the digital signal is a constant, wherein the predistortion gain reflects a change of the predistortion signal relative to the digital signal, and the amplification gain reflects a change of the radio frequency output signal relative to the radio frequency input signal.

19. The method according to claim 18, wherein the generating the supply voltage based on the predistortion signal comprises:

extracting the envelope signal of the predistortion signal;
converting the envelope signal into a digital voltage; and
converting the digital voltage into the supply voltage.

20. The method according to claim 19, wherein the converting the envelope signal into the digital voltage comprises: converting the envelope signal into the digital voltage based on a lookup table algorithm.

* * * * *